United States Patent [19]

Yamazaki

[11] Patent Number: 5,793,666
[45] Date of Patent: Aug. 11, 1998

[54] SINGLE-CHIP MEMORY SYSTEM HAVING AN ARRAY OF READ-ONLY MEMORY CELLS

[75] Inventor: Kazuyuki Yamazaki, Tokyo, Japan

[73] Assignee: NEC Corporation, Tokyo, Japan

[21] Appl. No.: 829,822

[22] Filed: Mar. 25, 1997

[30] Foreign Application Priority Data

Mar. 28, 1996 [JP] Japan ................................ 8-74692

[51] Int. Cl.[6] .................................................. G11C 17/00
[52] U.S. Cl. .................... 365/104; 365/63; 365/185.05; 365/185.06; 365/185.16; 365/185.17
[58] Field of Search ..................... 365/104, 63, 185.05, 365/185.06, 185.11, 185.13, 185.16, 185.17

[56] References Cited

U.S. PATENT DOCUMENTS 5,117,389  5/1992  Yiu ........................................... 365/104
5,583,808  12/1996  Brahmbhatt ........................... 365/185.05

FOREIGN PATENT DOCUMENTS 5167042  7/1993  Japan.

*Primary Examiner*—Tan T. Nguyen
*Attorney, Agent, or Firm*—Whitham, Curtis, Whitham

[57] ABSTRACT

To make a memory system highly integrated, a memory system includes a memory cell array including a first unit block and a second unit block having a plurality of read-only memory (ROM) cells, a plurality of diffused lines having a first pitch with respect to each other, and connected to sources of the ROM cells, first and second bit lines made of metal and respectively connected to drains of the ROM cells in the first and second unit blocks, and first and second source lines made of metal and respectively connected to sources of the ROM cells in the first and second unit blocks. A pitch between the first bit line and the first source line is a first pitch and a pitch between the first bit line and the second source line, and a pitch between the second bit line and the second source line are a second pitch. The second pitch is at least three times larger than the first pitch.

19 Claims, 8 Drawing Sheets

5,793,666

SINGLE-CHIP MEMORY SYSTEM HAVING AN ARRAY OF READ-ONLY MEMORY CELLS

BACKGROUND OF THE INVENTION

The present invention generally relates to a memory system, and more particularly to a memory system including an array of read-only memory (ROM) cells.

DESCRIPTION OF THE RELATED ART

A memory system having an array such as a ROM array (e.g., a mask ROM (MROM), an erasable and programmable ROM (EPROM), and an electrically erasable and programmable ROM ($E^2$PROM)) has an advantage over a memory system having an array such as a dynamic random access memory (DRAM) array, because a ROM can be made smaller than a DRAM.

FIG. 1 shows a conventional (e.g., related art but not prior art) single-chip memory device 11 having a memory cell array 1x configured as a ROM. The memory device 11 is operated by an external central processing unit (CPU) 22. The CPU 22 outputs an address signal containing a row address signal and a column address signal, a row address strobe (RAS) signal, and a column address strobe (CAS) signal to the memory device 11, and executes an instruction by using data from the device 11.

A row decoder 6 receives a row address signal and decodes the row address signal to choose a corresponding word line of a plurality of word lines in the memory cell array 1x, when the CPU 22 changes the RAS signal to an active high level (e.g., "1") from an inactive low level (e.g.,"0").

Selecting circuits 2x and 3x receive a column address signal and decodes the column address signal to get data from a corresponding ROM cell, when the CPU 22 changes the CAS signal to an active high level (e.g., "1") from an inactive low level (e.g., "0").

A precharge circuit 44 receives the column address signal and the CAS signal, changes voltage level of at least one among the source lines SLi corresponding to the column address signal, when the CPU 22 changes the CAS signal to an active level from an inactive level.

A sense amplifier 33 amplifies data from the corresponding ROM cell, and an output buffer 5 outputs the data to the CPU 22 when the CPU changes the CAS signal to an active high level from an inactive low level.

FIG. 2 shows a detailed construction of the memory cell array 1x and selecting circuits 2x, 3x shown in FIG. 1. In this exemplary explanation, a memory cell array 1x comprises EPROM cells.

The memory cell array 1x has a plurality of unit blocks Bi (where i is an integer) each having a plurality of metal oxide semiconductor (MOS) transistors Mjk (where j and k are integers and $1 \leq j \leq 4$, $1 \leq k \leq 16$) as EPROM cells. There are sixteen word lines WL1–WL16, and gates of the MOS transistors M1k, M2k, M3k and M4k are connected to a corresponding word line WLk (where k is an integer and $1 \leq k \leq 16$).

Each unit block Bi has four diffused lines D0–D3. A source-drain path of the MOS transistors M1k is connected between the diffused lines D0 and D1, a source-drain path of the MOS transistors M2k is connected between the diffused lines D1 and D2, a source-drain path of the MOS transistors M3k is connected between the diffused lines D2 and D3, and a source-drain path of the MOS transistors M4k is connected between the diffused line D3 and the diffused line D0 of the next adjacent unit block B(i+1).

The selecting circuit 2x has a plurality of N-type MOS transistors Q21, Q22 and Q23 corresponding to the unit block Bi. A source-drain path of MOS transistor Q21 is connected between the diffused lines D1 and D2, and a source-drain path of MOS transistor Q23 is connected between the diffused lines D2 and D3. A source-drain path of MOS transistor Q22 is connected between the diffused line D2 of the unit block Bi and a bit line BLi (where i is an integer) made of metal (e.g., aluminum). Gates of MOS transistors Q22 are connected to a metal line BS21, and gates of MOS transistors Q21 and Q23 are connected to a metal line BS22.

The selecting circuit 2x also has a decoder 21x for decoding a column address and for activating voltage levels on the metal lines BS21 and BS22 in response to the column address signal.

The selecting circuit 3x has a plurality of N-type MOS transistors Q30, Q31 and Q32 corresponding to the unit block Bi. A source-drain path of MOS transistor Q31 is connected between the diffused lines D0 and D1, and a source-drain path of MOS transistor Q32 is connected between the diffused line D3 and the diffused line D0 of the next adjacent unit block B(i+1). A source-drain path of MOS transistor Q30 is connected between the diffused line DO of the unit block Bi and a source line SLi (where i is an integer) made of metal (e.g., aluminum). Gates of MOS transistors Q30 are connected to a metal line BS32, and gates of MOS transistors Q31 and Q32 are connected to a metal line BS31.

The selecting circuit 3x also has a decoder 31x for decoding a column address and for activating voltage levels on the metal lines BS31 and BS32 in response to the column address signal.

The diffused lines D0–D3 are made, for example, by injecting ions into a semiconductor substrate (e.g., an ion injecting method). Then, an insulator film is deposited on the diffused lines D0–D3, and the bit lines BLi and the source lines SLi are made on the insulator film by sputtering metal on the film (e.g., a sputtering method) or by vaporizing metal on the film (e.g., a vaporizing method including, for example, chemical vapor deposition or plasma vapor deposition). The bit lines BLi are connected to the sense amplifier 33, and the source lines SLi are connected to the precharge circuit 4.

Each of the MOS transistors Mjk is programmed in advance. Therefore, if one of the MOS transistors Mjk has data (e.g., "1"), a source-drain path of the one of the MOS transistors Mjk is not formed electrically when a corresponding word line WLk is changed to an active high level (e.g., "1") from an inactive low level (e.g., "0"). To the contrary, a source-drain path of the one of the MOS transistors Mjk is formed electrically when a corresponding word line WLk is changed to an active high level if the one of the MOS transistors Mjk has no data (e.g., "0").

Hereinbelow, the operation of the circuit shown in FIG. 2 is described.

First, the sense amplifier 33 precharges all of the bit lines BLi to a precharge level before the device 11 receives an address signal.

For example, when the device 11 receives an address signal corresponding to the MOS transistor M11 of the unit block B2, the decoder 21x changes voltage levels of the metal lines BS21 and BS22 to an active high level. Therefore, the MOS transistors Q21, Q22 and Q23 become "ON" (e.g., turn-on) to connect the diffused lines D1, D2 and D3 electrically together, and to connect the diffused lines D1–D3 to a corresponding bit line BLi.

The decoder 31x changes a voltage level of the metal line BS32 to an active high level and changes a voltage level of the metal line BS31 to an inactive low level. Therefore, the MOS transistors Q30 become "ON" to connect the diffused line D0 to the source line SLi. In this case, the MOS transistors Q31 and Q32 become "OFF" (e.g., turn-off). Therefore, all of the sources and drains of a plurality of MOS transistors M1k are connected to corresponding bit lines BLi and source lines SLi.

The precharge circuit 44 changes a voltage level of the source line SL2 to a reference voltage level (e.g., ground level) from the precharge level in response to the address signal. The precharge circuit 44 maintains voltage levels of the source lines SLi (except for the source line SL2) at the precharge level.

Next, the row decoder 6 changes a voltage level of the word line WL1 to an active level to select the MOS transistors Mj1. At this time, if the MOS transistor M11 of the unit block B2 has data (e.g., "1"), the voltage level of the bit line BL2 is maintained at the precharge level, because the MOS transistor M11 of the unit block B2 cannot connect the bit line BL2 to the source line SL2 electrically. If the MOS transistor M11 of the unit block B2 has no data (e.g., "0"), the voltage level of the bit line BL2 becomes the reference voltage level (e.g., ground level), because the MOS transistor M11 of the unit block B2 can connect the bit line BL2 to the source line SL2 electrically.

Voltage levels of the bit lines BLi (except for the bit line BL2) are maintained at the precharge level, because corresponding source lines SLi except for the source line SL2 have the precharge level as set by the precharge circuit 44.

Therefore, the device 11 outputs the data of the MOS transistor M11 of the unit block B2 by using the bit line BL2.

However, a problem occurs when a highly-integrated memory device is to be formed, because an integration ratio of the conventional memory device 11 in FIG. 1 is technically limited. Specifically, metal lines having a pitch less than 1.5 μm cannot be made presently, and therefore a minimum pitch of the bit lines BLi in FIG. 2 is about 1.5 μm which is a standard pitch. Thus, a memory system having higher integration cannot be obtained, if a standard pitch of the metal lines is used.

SUMMARY OF THE INVENTION

In view of the foregoing problems of the conventional memory systems, it is therefore an object of the present invention to provide an improved memory system.

It is another object of the present invention to provide an improved construction of a memory cell array and selecting circuits.

In a first aspect, a memory system according to the present invention includes a memory cell array including a first unit block and a second unit block having a plurality of read-only memory (ROM) cells, and a plurality of diffused lines having a first pitch with respect to each other, and connected to sources of the ROM cells. Further, the system includes first and second metallic bit lines respectively connected to drains of the ROM cells in the first and second unit blocks, and first and second metallic source lines respectively connected to sources of the ROM cells in the first and second unit blocks. A pitch between the first bit line and the first source line, a pitch between the first bit line and the second source line, and a pitch between the second bit line and the second source line each comprise a second pitch, with the second pitch being at least three times larger than the first pitch.

With the unique and unobvious structure of the present invention, it is possible to make a pitch between diffused lines less than one-third of a pitch between the bit line and the source line, because a pitch between diffused lines becomes a standard pitch.

Therefore, the memory system can be integrated more highly than the related art system.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
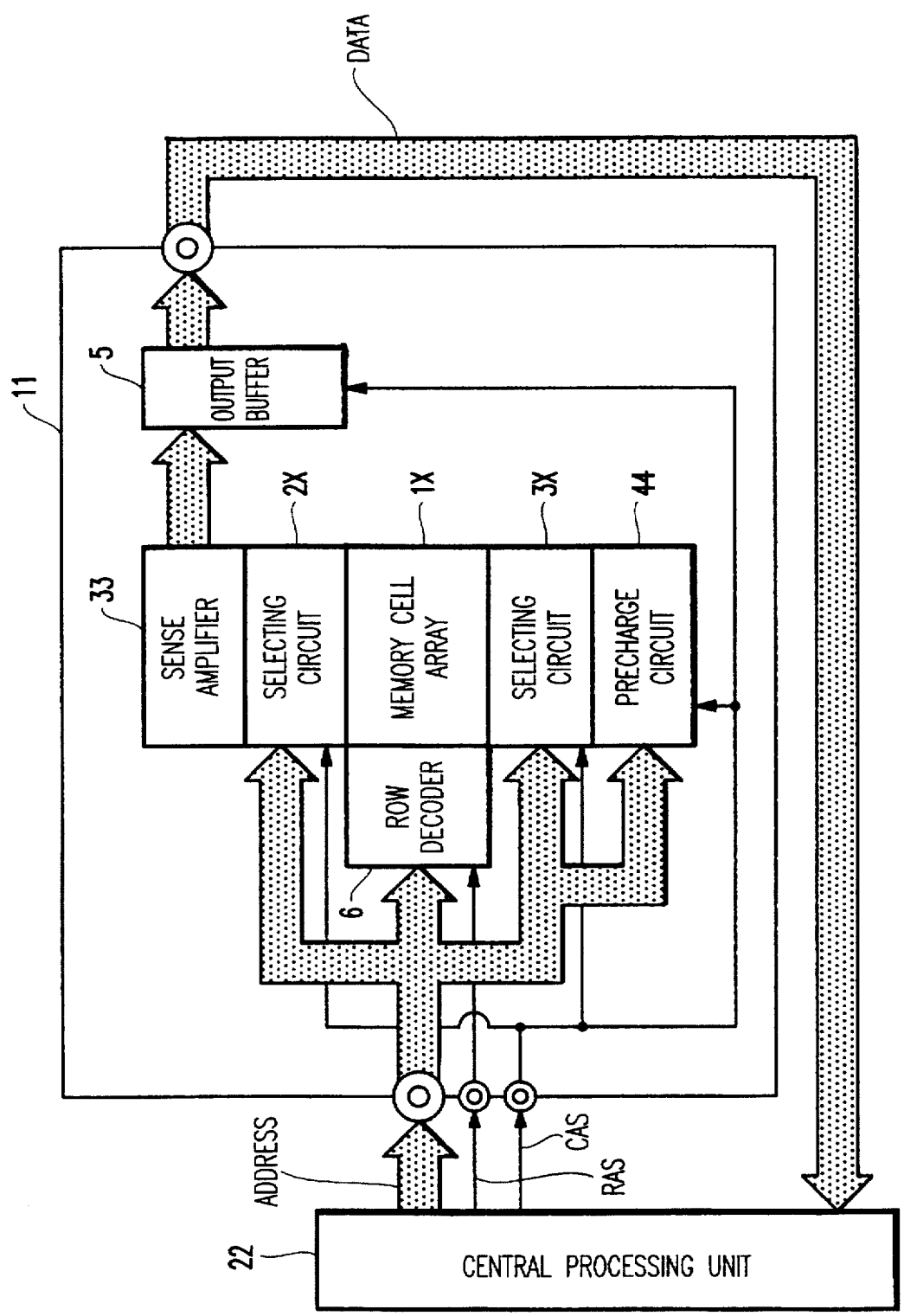
FIG. 1 is a diagram showing a related memory system 11.
Figure 3:
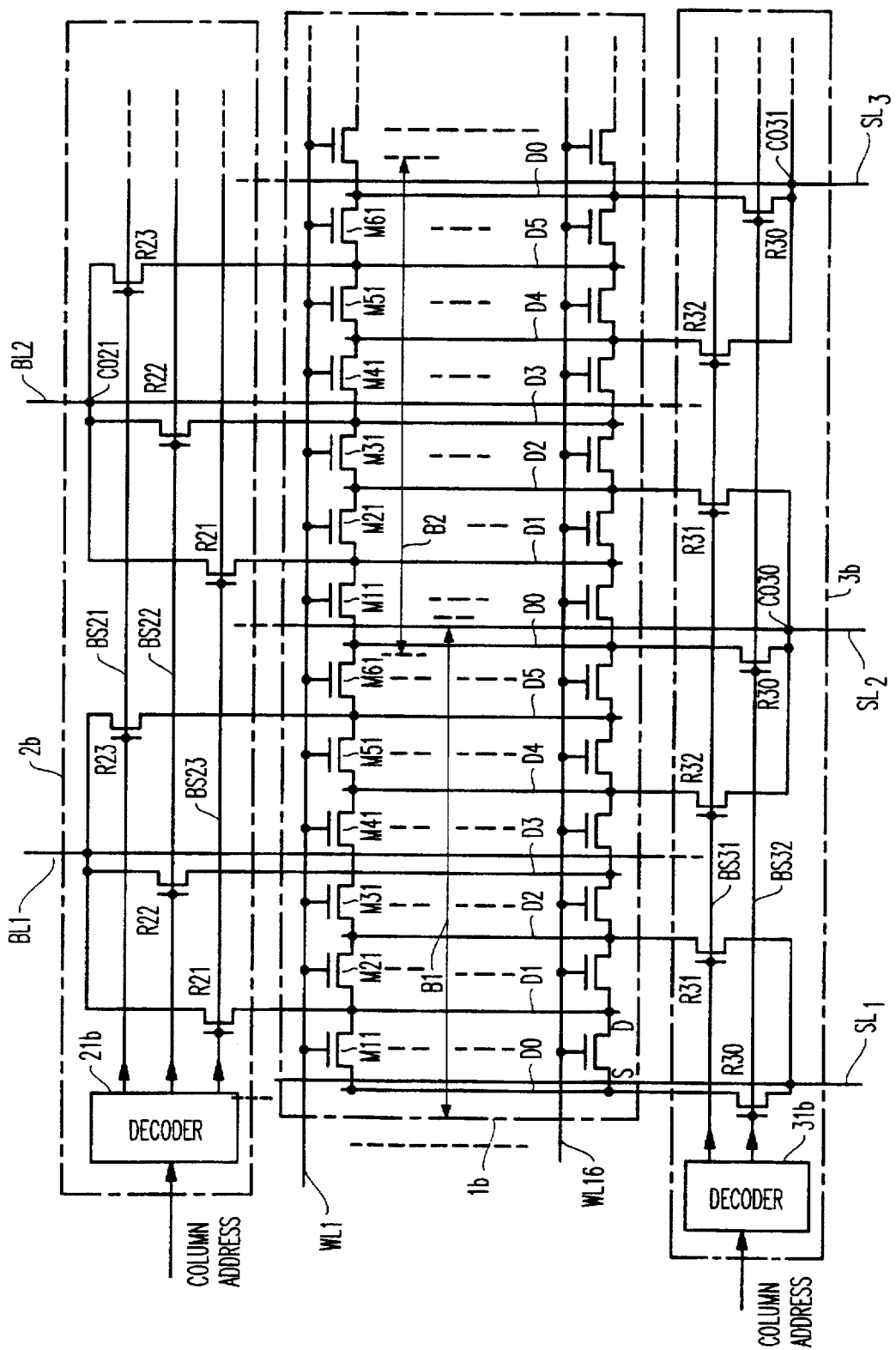
FIG. 3 illustrates a first embodiment showing details of a memory cell array 1b and selecting circuits 2b, 3b of a memory system according to the present invention.

Referring now to the drawings, and more particularly to FIG. 3, a single-chip semiconductor memory system according to a first embodiment of the present invention is shown. The single-chip semiconductor memory system has the same construction as shown in FIG. 1 except for the memory cell array 1x and selecting circuits 2x and 3x shown in FIG. 1. Therefore, for brevity and focus of explanation, a memory cell array 1b, and selecting circuits 2b and 3b are described primarily below. For convenience, the same portions in FIG. 3 as those in FIG. 1 are numbered with the same reference numerals in FIG. 1 and, for brevity, explanations of these portions are omitted from the following description. Further, the following embodiments use a pitch of the diffused lines as a standard because a pitch of the diffused lines can be made smaller than a conventional minimum pitch (e.g., about 1.5 μm) of metal lines.

FIG. 3 shows a detailed construction of a memory cell array 1b and selecting circuits 2b, 3b as explained above. The memory cells array 1b preferably comprises an array of EPROM cells.

A memory cell array 1b has a plurality of unit blocks Bi (where i is an integer) each having a plurality of MOS transistors Mjk (where j and k are integers and preferably $1 \leq j \leq 6$, $1 \leq k \leq 16$) as EPROM cells. There are preferably sixteen word lines WL1–WL16, and gates of the MOS transistors M1k, M2k, M3k, M4k, M5k and M6k are connected to a corresponding word line WLk (where k is an integer and preferably $1 \leq k \leq 16$).

Each unit blocks Bi has six diffused lines D0–D5. A source-drain path of the MOS transistors M1k is connected between the diffused lines D0 and D1, a source-drain path of the MOS transistors M2k is connected between the diffused lines D1 and D2, a source-drain path of the MOS transistors M3k is connected between the diffused lines D2 and D3, a source-drain path of the MOS transistors M4k is connected between the diffused lines D3 and D4, a source-drain path of the MOS transistors M5k is connected between the diffused lines D4 and D5, and a source-drain path of the MOS transistors M6k is connected between the diffused line D5 and the diffused line D0 of the next adjacent unit block B(i+1).

The selecting circuit 2b has a plurality of N-type MOS transistors R21, R22 and R23 corresponding to the unit block Bi. A source-drain path of MOS transistor R21 is connected between the diffused line D1 and a bit line BLi (where i is an integer) preferably made of metal (e.g., aluminum), and a source-drain path of MOS transistor R22 is connected between the diffused line D3 and the bit line BLi. A source-drain path of MOS transistor R23 is connected between the diffused line D5 and the bit line BLi. Gates of a plurality of MOS transistors R21 are connected to a metal line BS23, gates of a plurality of MOS transistors R22 are connected to a metal line BS22, and gates of a plurality of MOS transistors R23 are connected to a metal line BS21.

The selecting circuit 2b also has a decoder 21b for decoding a column address and for activating voltage levels on the metal lines BS21, BS22 and BS23 in response to the column address signal.

The selecting circuit 3b has a plurality of N-type MOS transistors R30, R31 and R32 corresponding to the unit block Bi. A source-drain path of MOS transistor R30 is connected between the diffused lines D0 and a source line SLi (where i is an integer) preferably made of metal (e.g., aluminum), a source-drain path of MOS transistor R31 is connected between the diffused line D2 and the source line SLi, and a source-drain path of MOS transistor R32 is connected between the diffused line D4 and a next source line SL(i+1) of the next adjacent unit block B(i+1). Gates of a plurality of MOS transistors R30 are connected to a metal line BS32, and gates of a plurality of MOS transistors R31 and R32 are connected to a metal line BS31.

The selecting circuit 3b also has a decoder 31b for decoding a column address and for activating voltage levels on the metal lines BS31 and BS32 in response to the column address signal.

The diffused lines D0–D5 are made preferably by injecting ions into a semiconductor substrate (e.g., an ion injection method). Then, an insulator film is deposited on the diffused lines D0–D5, and the bit lines BLi and the source lines SLi are made on the insulator film by sputtering metal on the film (e.g., a sputtering method) or by vaporizing metal on the film (e.g., a vaporizing method). The bit lines BLi are connected to the sense amplifier 34, and the source lines SLi are connected to the precharge circuit 44 shown in FIG. 1.

Each of MOS transistors Mjk is programmed during production of the device. Therefore, if one of the MOS transistors Mjk has data (e.g., "1"), a source-drain path of the one of the MOS transistors Mjk is not formed electrically when a corresponding word line WLk is changed to an active high level (e.g., "1") from an inactive low level (e.g., "0"). To the contrary, a source-drain path of the one of the MOS transistors Mjk is formed electrically when a corresponding word line WLk is changed to an active high level if the one of the MOS transistors Mjk has no data (e.g., "0").

Hereinbelow, the operation of the circuit shown in FIG. 3 is described.

First, the sense amplifier 33 shown in FIG. 1 precharges all of the bit lines BLi to a precharge level before the selecting circuits 2b and 3b receive an address signal.

Then, for example, when the selecting circuits 2b and 3b receive an address signal corresponding to the MOS transistor M11 of the unit block B2, the decoder 21b changes voltage levels of the metal lines BS23 to an active high level. Therefore, a plurality of MOS transistors R21 become "ON" (e.g., turn-on) to connect the diffused lines D1 to a corresponding bit line BLi.

The decoder 31b changes a voltage level of the metal line BS32 to an active high level and changes a voltage level of the metal line BS31 to an inactive low level. Therefore, the MOS transistor R30 become "ON" to connect the diffused line D0 to a corresponding source line SLi. In this case, the MOS transistors R31 and R32 become "OFF". Therefore, all of the sources and drains of a plurality of MOS transistors M1k are connected to corresponding bit lines BLi and source lines SLi.

However, the precharge circuit 44 shown in FIG. 1 changes a voltage level of the source line SL2 to a reference voltage level (e.g., ground level) from the precharge level in response to the address signal. The precharge circuit 44 maintains voltage levels of the source lines SLi (except for the source line SL2) to the precharge level.

Thereafter, the row decoder 6 shown in FIG. 1 changes a voltage level of the word line WL1 to an active level to select the MOS transistors Mj1. At this time, if the MOS transistor M11 of the unit block B2 has data (e.g., "1"), the voltage level of the bit line BL2 is maintained at the precharge level, because the MOS transistor M11 of the unit block B2 cannot connect the bit line BL2 to the source line SL2 electrically. If the MOS transistor M11 of the unit block B2 has no data (e.g., "0"), the voltage level of the bit line BL2 becomes the reference voltage level (e.g., ground level), because the MOS transistor M11 of the unit block B2 can connect the bit line BL2 to the source line SL2 electrically.

Voltage levels of the bit lines BLi (except for the bit line BL2) are maintained at the precharge level, because corresponding source lines SLi (except for the source line SL2) have the precharge level as set by the precharge circuit 44.

Therefore, the single-chip device according to the first embodiment can output the data of the MOS transistor M11 of the unit block B2 by using the bit line BL2.

Figure 4:
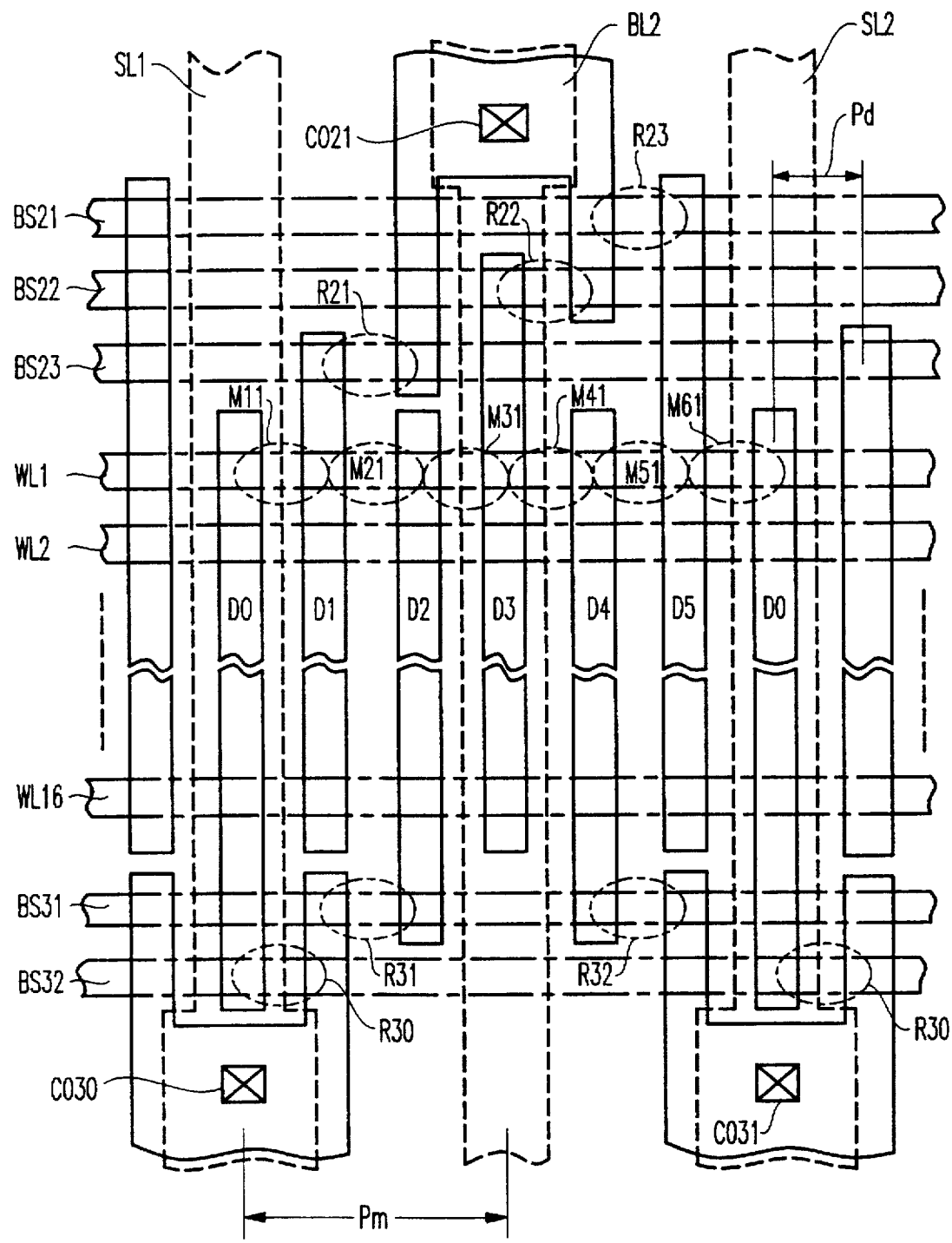
FIG. 4 is a diagram showing an arrangement of memory cell array 1b and selecting circuits 2b, 3b in the device of FIG. 3.

FIG. 4 shows a layout diagram of respective parts of the first embodiment shown in FIG. 3. Diffused lines D0–D5 are constructed parallel to each other in a semiconductor substrate by an ion injecting method. After an insulating film (not illustrated) is deposited on the semiconductor substrate, metal lines BS21, BS22, BS23, BS31, BS32 and WL1–WL16 parallel to each other and perpendicular to the diffused lines D0–D5, are constructed on the insulating film. After another insulating film (not illustrated) is further deposited, bit lines BLi and source lines SLi parallel to the diffused lines D0–D5 are constructed by a sputtering method. Each bit line BLi and source line SLi is connected to corresponding MOS transistors through a corresponding contact hole (e.g., contact holes C021, C030 and C031).

Figure 2:
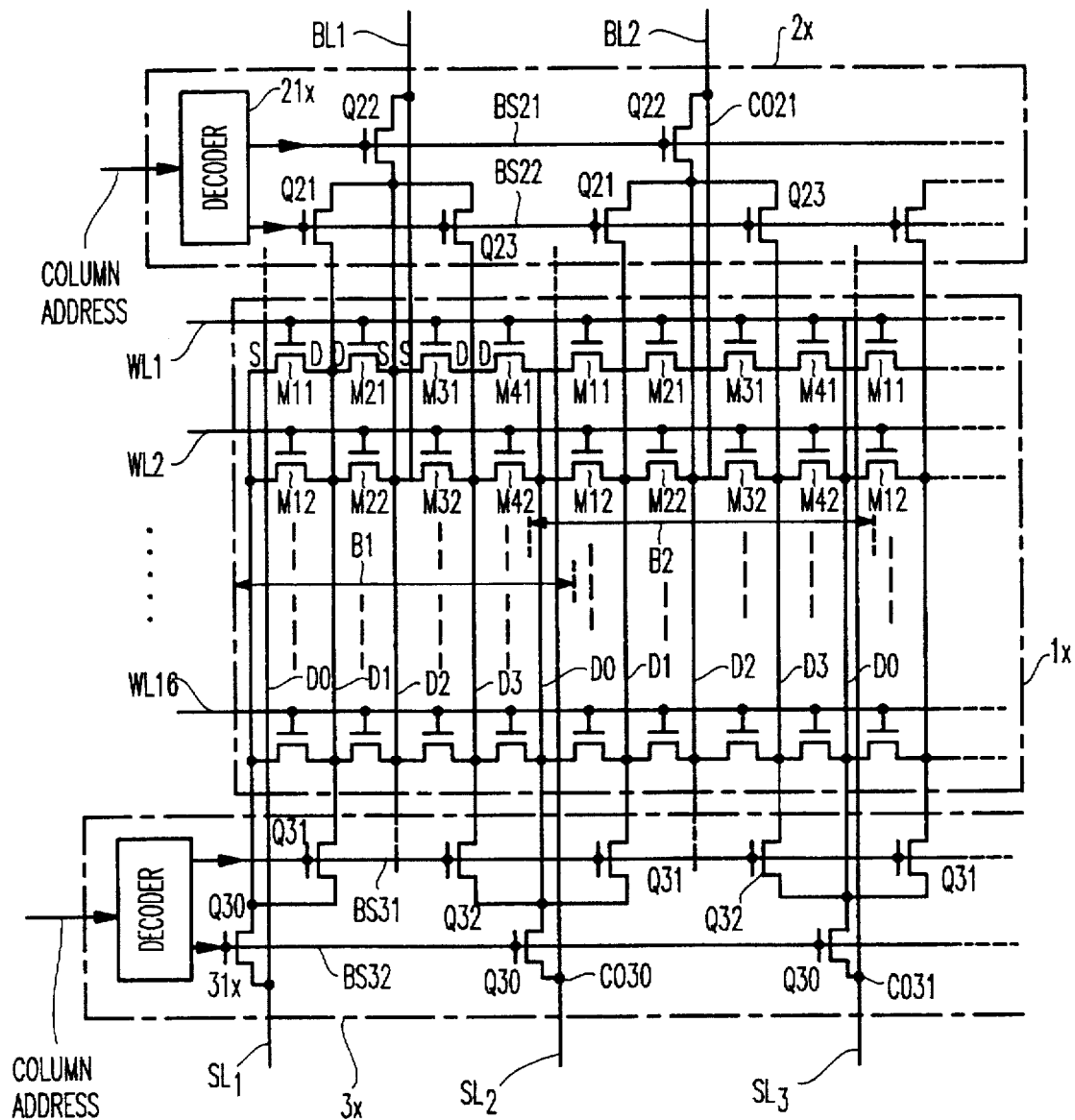
FIG. 2 is a diagram showing details of a memory cell array 1x and selecting circuits 2x, 3x of the memory system 11 shown in FIG. 1.

In the first embodiment, a pitch Pm of metal wires need not be 1.5 μm. Pitch Pm can be greater than 1.5 μm because a minimum pitch of metal wires is not a standard in this embodiment. In this embodiment, a pitch of the diffused lines is the standard. For example, a pitch Pm of metal wires will be 1.8 μm (e.g., 3×0.6 μm) if a pitch Pd of the diffused lines is 0.6 μm according to the designer's requirements although actually a minimum pitch of the diffused lines could be reduced to 0.2 μm with the present technique. However, it is apparent that the device according to the first embodiment has higher integration than that of the device shown in FIG. 2, because the pitch Pd in FIG. 2 is 0.75 μm.

As mentioned above, the device of the first embodiment has high integration. However, various memory devices may be fabricated according to the present invention. Therefore, other exemplary devices according to the present invention are explained below.

Figure 5:
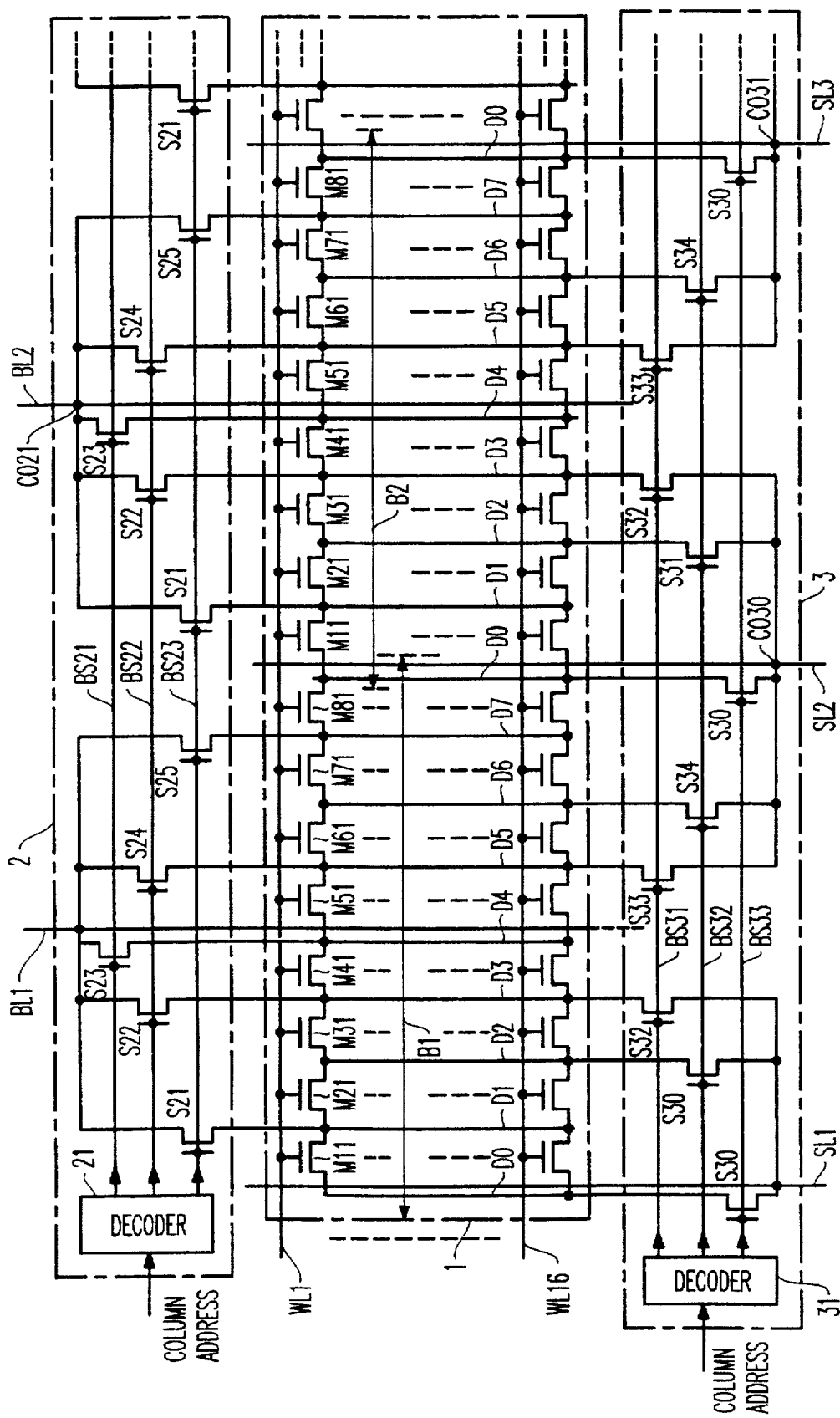
FIG. 5 illustrates a second embodiment showing details of a memory cell array 1 and selecting circuits 2, 3 of a memory system according to the present invention.

FIG. 5 shows a detailed construction of a memory cell array 1 and selecting circuits 2, 3 of a second embodiment of the present invention.

A memory cell array 1 has a plurality of unit blocks Bi (where i is an integer) each having a plurality of MOS transistors Mjk (where j and k are integers and preferably $1 \leq j \leq 8$, $1 \leq k \leq 16$) as EPROM cells. There are preferably sixteen word lines WL1–WL16, and gates of the MOS transistors M1k, M2k, M3k, M4k, M5k, M6k, M7k and M8k are connected to a corresponding word line WLk (where k is an integer and preferably $1 \leq k \leq 16$).

Each unit block Bi has eight diffused lines D0–D7. A source-drain path of the MOS transistors M1k is connected between the diffused lines D0 and D1, a source-drain path of the MOS transistors M2k is connected between the diffused lines D1 and D2, a source-drain path of the MOS transistors M3k is connected between the diffused lines D2 and D3, a source-drain path of the MOS transistors M4k is connected between the diffused lines D3 and D4, a source-drain path of the MOS transistors M5k is connected between the diffused lines D4 and D5, a source-drain path of the MOS transistors M6k is connected between the diffused lines D5 and D6, a source-drain path of the MOS transistors M7k is connected between the diffused lines D6 and D7, and a source-drain path of the MOS transistors M8k is connected between the diffused line D7 and the diffused line D0 of the next adjacent unit block B(i+1).

The selecting circuit 2 has a plurality of N-type MOS transistors R21–R25 corresponding to the unit block Bi. A source-drain path of MOS transistor S21 is connected between the diffused line D1 and a bit line BLi (where i is an integer) preferably made of metal (e.g., aluminum), and a source-drain path of MOS transistor S22 is connected between the diffused line D3 and the bit line BLi. A source-drain path of MOS transistor S23 is connected between the diffused line D4 and the bit line BLi. A source-drain path of MOS transistor S24 is connected between the diffused line D5 and the bit line BLi and a source-drain path of MOS transistor S25 is connected between the diffused line D7 and the bit line BLi.

Gates of a plurality of MOS transistors S21 are connected to a metal line BS23, gates of a plurality of MOS transistors S22 and S24 are connected to a metal line BS22, and gates of a plurality of MOS transistors S23 are connected to a metal line BS21.

The selecting circuit 2 also has a decoder 21 for decoding a column address and for activating voltage levels on the metal lines BS21, BS22 and BS23 in response to the column address signal.

The selecting circuit 3 has a plurality of N-type MOS transistors S30, S31, S32, S33 and S34 corresponding to the unit block Bi. A source-drain path of MOS transistor S30 is connected between the diffused lines D0 and a source line SLi (where i is an integer) preferably made of metal (e.g., aluminum), and a source-drain path of MOS transistor S31 is connected between the diffused line D2 and the source line SLi. A source-drain path of MOS transistor S32 is connected between the diffused lines D3 and a source line SLi, a source-drain path of MOS transistor S33 is connected between the diffused line D5 and a source line SL(i+1) of the next adjacent unit block B(i+1), and a source-drain path of MOS transistor S34 is connected between the diffused line D6 and the source line SL(i+1).

Gates of a plurality of MOS transistors S30 are connected to a metal line BS33, gates of a plurality of MOS transistors S31 and S34 are connected to a metal line BS32, and gates of a plurality of MOS transistors S32 and S33 are connected to a metal line BS31.

The selecting circuit 3 also has a decoder 31 for decoding a column address and for activating voltage levels on the metal lines BS31, BS32 and BS33 in response to the column address signal.

Hereinbelow, the operation of the circuit shown in FIG. 5 is described.

First, the sense amplifier 33 shown in FIG. 1 precharges all of the bit lines BLi to a precharge level before the selecting circuits 2 and 3 receive an address signal.

Then, for example, when the selecting circuits 2 and 3 receive an address signal corresponding to the MOS transistor M11 of the unit block B2, the decoder 21 changes voltage levels of the metal lines BS23 to an active high level. Therefore, a plurality of MOS transistors S21 and S25 become "ON" to connect the diffused lines D1 and D7 to a corresponding bit line BLi.

The decoder 31 changes a voltage level of the metal line BS33 to an active high level and changes a voltage level of the metal line BS31 and BS32 to an inactive low level. Therefore, the MOS transistors S30 become "ON" to connect the diffused line D0 to a corresponding source line SLi. In this case, the MOS transistors S31, S32, S33 and S34 become "OFF". Therefore, all of the sources and drains of a plurality of MOS transistors M1k and M8k are connected to corresponding bit lines BLi and source lines SLi.

However, the precharge circuit 44 shown in FIG. 1 changes a voltage level of the source line SL2 to a reference voltage level (e.g., ground level) from the precharge level in response to the address signal. The precharge circuit 44 maintains voltage levels of the source lines SLi (except for the source line SL2) to the precharge level.

Then, the row decoder 6 shown in FIG. 1 changes a voltage level of the word line WL1 to an active level to select the MOS transistors Mj1. At this time, if the MOS transistor M11 of the unit block B2 has data (e.g., "1"), the voltage level of the bit line BL2 is maintained at the precharge level, because the MOS transistor M11 of the unit block B2 cannot connect the bit line BL2 to the source line SL2 electrically. If the MOS transistor M11 of the unit block B2 has no data (e.g., "0"), the voltage level of the bit line BL2 becomes the reference voltage level (e.g., ground level), because the MOS transistor M11 of the unit block B2 can connect the bit line BL2 to the source line SL2 electrically.

Voltage levels of the bit lines BLi (except for the bit line BL2) are maintained at the precharge level, because corresponding source lines (SLi except for the source line SL2) have the precharge level as set by the precharge circuit 44.

Therefore, the single-chip device according to the second embodiment can output the data of the MOS transistor M11 of the unit block B2 by using the bit line BL2.

In this embodiment, a pitch of the diffused lines is the standard pitch. For example, a pitch Pm of metal wires will be 1.6 μm (e.g., 4×0.4 μm) if a pitch Pd of diffused lines is 0.4 μm according to the designer's requirements although actually a minimum pitch of diffused lines could be reduced to as low as 0.2 μm with the present technique. However, it is apparent that the device according to the second embodiment and shown in FIG. 5 also has higher integration than the device shown in FIG. 2, because the pitch Pd in FIG. 2 is 0.75 μm.

Figure 6:
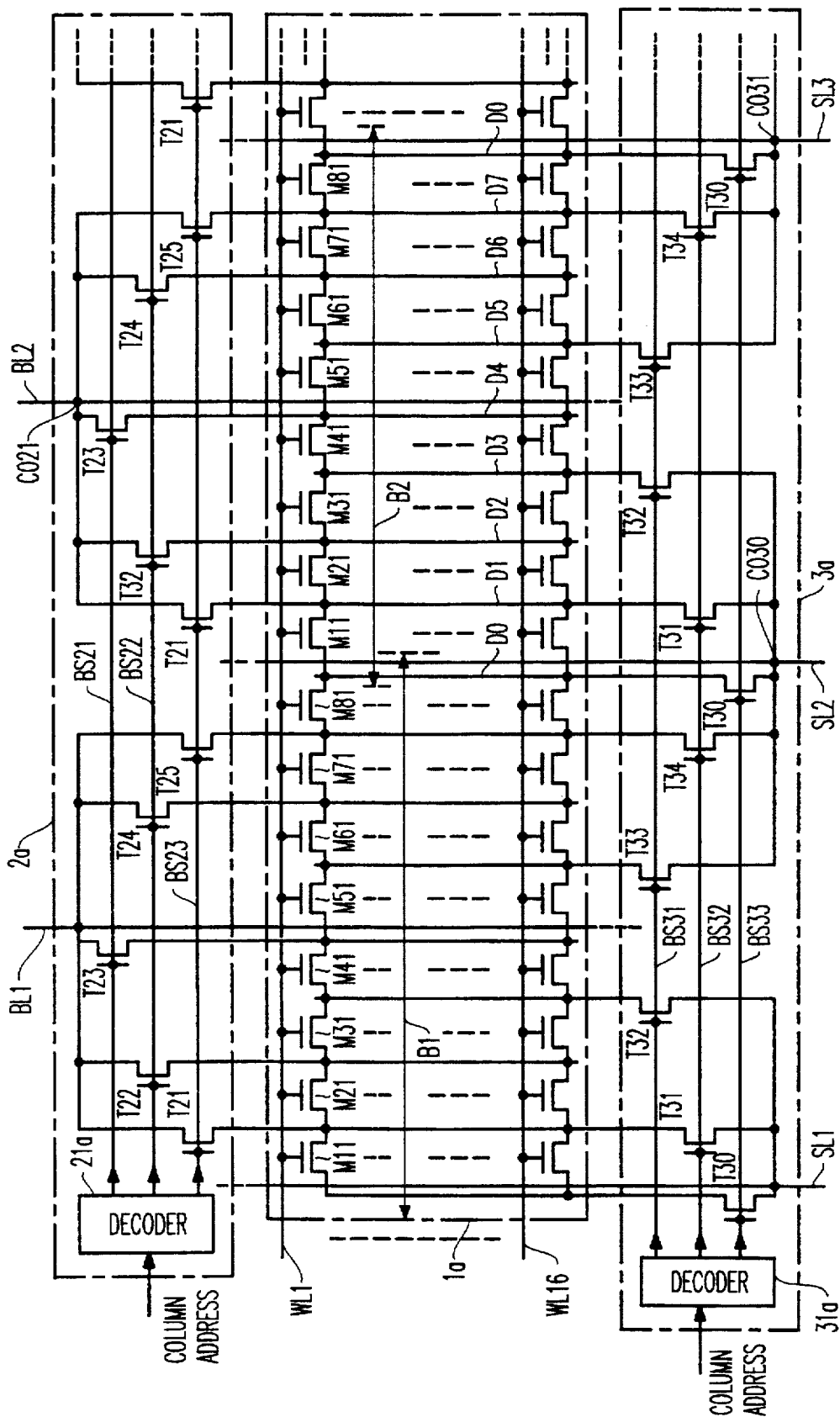
FIG. 6 illustrates a third embodiment showing details of a memory cell array 1a and selecting circuits 2a, 3a of a memory system according to the present invention.

FIG. 6 shows a detailed construction of a memory cell array 1a and selecting circuits 2a, 3a of a third embodiment of the present invention. The device of FIG. 6 has a similar connection structure as that of the device of FIG. 5.

Specifically, the selecting circuit 2a has a plurality of N-type MOS transistors T21-T25 corresponding to the unit block Bi. A source-drain path of MOS transistor T21 is connected between the diffused line D1 and a bit line BLi, and a source-drain path of MOS transistor T22 is connected between the diffused line D2 and the bit line BLi. A source-drain path of MOS transistor T23 is connected between the diffused line D4 and the bit line BLi. A source-drain path of MOS transistor T24 is connected between the diffused line D6 and the bit line BLi and a source-drain path of MOS transistor T25 is connected between the diffused line D7 and the bit line BLi.

Gates of a plurality of MOS transistors T21 and T25 are connected to a metal line BS23, gates of a plurality of MOS transistors T22 and T24 are connected to a metal line BS22, and gates of a plurality of MOS transistors T23 are connected to a metal line BS21.

The selecting circuit 2a also has a decoder 21a for decoding a column address and for activating voltage levels on the metal lines BS21, BS22 and BS23 in response to the column address signal.

The selecting circuit 3a has a plurality of N-type MOS transistors T30-T34 corresponding to the unit block Bi. A source-drain path of MOS transistor T30 is connected between the diffused line D0 and a source line SLi, a source-drain path of MOS transistor T31 is connected between the diffused line D1 and the source line SLi. A source-drain path of MOS transistor T32 is connected between the diffused line D3 and a source line SLi, a source-drain path of MOS transistor T33 is connected between the diffused line D5 and a source line SL(i+1) of the next adjacent unit block B(i+1), and a source-drain path of MOS transistor T34 is connected between the diffused line D7 and the source line SL(i+1).

Gates of a plurality of MOS transistors T30 are connected to a metal line BS33, gates of a plurality of MOS transistors T31 and T34 are connected to a metal line BS32, and gates of a plurality of MOS transistors T32 and T33 are connected to a metal line BS31.

The selecting circuit 3a also has a decoder 31a for decoding a column address and for activating voltage levels on the metal lines BS31, BS32 and BS33 in response to the column address signal.

Hereinbelow, the operation of the circuit shown in FIG. 6 is described.

First, the sense amplifier 3 shown in FIG. 1 precharges all of the bit lines BLi to a precharge level before the selecting circuits 2a and 3a receive an address signal.

Then, for example, when the selecting circuits 2a and 3a receive an address signal corresponding to the MOS transistor M31 of the unit block B2, the decoder 21 changes voltage levels of the metal lines BS22 to an active high level. Therefore, a plurality of MOS transistors T22 and T24 become "ON" to connect the diffused lines D2 and D6 to a corresponding bit line BLi.

The decoder 31a changes a voltage level of the metal line BS31 to an active high level and changes a voltage level of the metal line BS32 and BS33 to an inactive low level. Therefore, the MOS transistors T32 and T33 become "ON" to connect the diffused line D3 to a corresponding source line SLi. In this case, the MOS transistors S30, S31 and S34 become "OFF". Therefore, all of the sources and drains of a plurality of MOS transistors M3k are connected to corresponding bit lines BLi and source lines SLi.

However, the precharge circuit 44 shown in FIG. 1 changes a voltage level of the source line SL2 to a reference voltage level (e.g., ground level) from the precharge level in response to the address signal. The precharge circuit 44 maintains voltage levels of the source lines SLi (except for the source line SL2) to the precharge level.

Then, the row decoder 6 shown in FIG. 1 changes a voltage level of the word line WL1 to an active level to select the MOS transistors Mj1. At this time, if the MOS transistor M31 of the unit block B2 has data (e.g., "1"), the voltage level of the bit line BL2 is maintained at the precharge level, because the MOS transistor M31 of the unit block B2 cannot connect the bit line BL2 to the source line SL2 electrically. If the MOS transistor M31 of the unit block B2 has no data (e.g., "0"), the voltage level of the bit line BL2 becomes the reference voltage level (e.g., ground level), because the MOS transistor M31 of the unit block B2 can connect the bit line BL2 to the source line SL2 electrically.

Voltage levels of the bit lines BLi (except for the bit line BL2) are maintained at the precharge level, because corresponding source lines SLi (except for the source line SL2) have the precharge level as set by the precharge circuit 44.

Therefore, the single-chip device according to the third embodiment can output the data of the MOS transistor M31 of the unit block B2 by using the bit line BL2. It is also apparent that the device according to the third embodiment also has higher integration than the device shown in FIG. 2.

Figure 7:
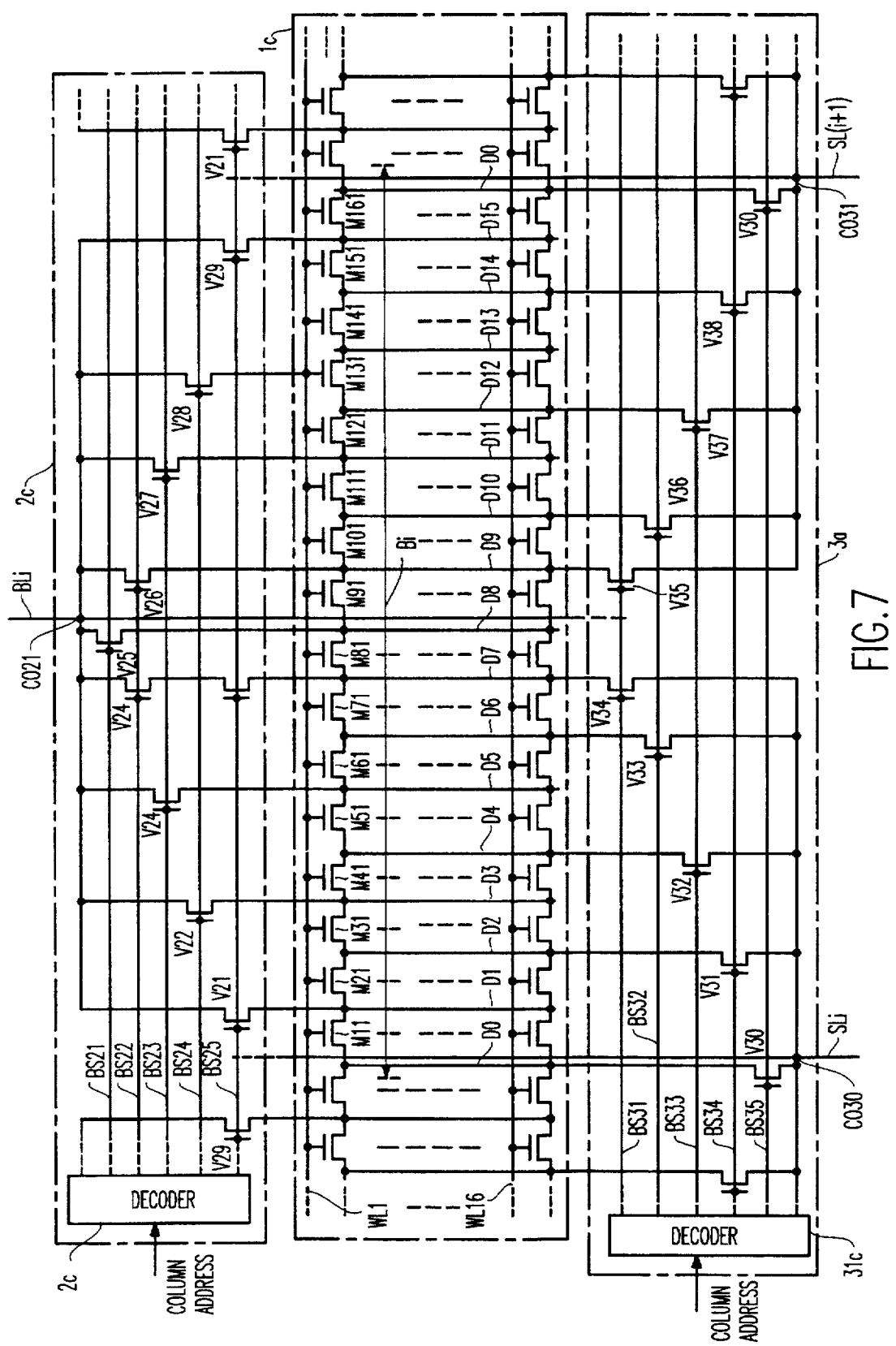
FIG. 7 illustrates a fourth embodiment showing details of a memory cell array 1c and selecting circuits 2c, 3c of a memory system according to the present invention.

FIG. 7 shows a detailed construction of a memory cell array 1c and selecting circuits 2c, 3c as a fourth embodiment of the present invention. The fourth embodiment is the most preferable embodiment because a pitch Pd of diffused lines is 0.2 μm which is a minimum pitch with the present technique.

A memory cell array 1c has a plurality of unit blocks Bi (where i is an integer) each having a plurality of MOS transistors Mjk (where j and k are integers and preferably $1 \leq j \leq 16$, $1 \leq k \leq 16$) as EPROM cells. There are preferably sixteen word lines WL1-WL16, and gates of the MOS transistors M1k-M16k are connected to a corresponding word line WLk (where k is an integer and preferably $1 \leq k \leq 16$).

Each unit block Bi has sixteen diffused lines D0-D15. A source-drain path of the MOS transistors M1k is connected between the diffused lines D0 and D1, a source-drain path of the MOS transistors M2k is connected between the diffused lines D1 and D2, a source-drain path of the MOS transistors M3k is connected between the diffused lines D2 and D3, a source-drain path of the MOS transistors M4k is connected between the diffused lines D3 and D4, a source-drain path of the MOS transistors M5k is connected between the diffused lines D4 and D5, a source-drain path of the MOS transistors M6k is connected between the diffused lines D5 and D6, a source-drain path of the MOS transistors M7k is connected between the diffused lines D6 and D7, a source-drain path of the MOS transistors M8k is connected between the diffused lines D7 and D8, a source-drain path of the MOS transistors M9k is connected between the diffused lines D8 and D9, a source-drain path of the MOS transistors M10k is connected between the diffused lines D9 and D10, a source-drain path of the MOS transistors M11k is connected between the diffused lines D10 and D11, a source-drain path of the MOS transistors M12k is connected between the diffused lines D1 and D12, a source-drain path of the MOS transistors M13k is connected between the diffused lines D12 and D13, a source-drain path of the MOS transistors M14k is connected between the diffused lines D13 and D14, a source-drain path of the MOS transistors M15k is connected between the diffused lines D14 and D15, and a source-drain path of the MOS transistors M16k is connected between the diffused line D15 and the diffused line D0 of a next adjacent unit block B(i+1).

The selecting circuit 2c has a plurality of N-type MOS transistors U21–U29 corresponding to the unit block Bi. A source-drain path of MOS transistor U21 is connected between the diffused line D1 and a bit line BLi (where i is an integer) preferably made of metal (e.g., aluminum), and a source-drain path of MOS transistor U22 is connected between the diffused line D3 and the bit line BLi. A source-drain path of MOS transistor U23 is connected between the diffused line D5 and the bit line BLi and a source-drain path of MOS transistor U24 is connected between the diffused line D7 and the bit line BLi. A source-drain path of MOS transistor U25 is connected between the diffused line D8 and the bit line BLi. A source-drain path of MOS transistor U26 is connected between the diffused line D9 and a bit line BLi and a source-drain path of MOS transistor U27 is connected between the diffused line D11 and the bit line BLi. A source-drain path of MOS transistor U28 is connected between the diffused line D13 and the bit line BLi and a source-drain path of MOS transistor U29 is connected between the diffused line D15 and the bit line BLi.

Gates of a plurality of MOS transistors U21 and U29 are connected to a metal line BS25, gates of a plurality of MOS transistors U22 and U28 are connected to a metal line BS24, and gates of a plurality of MOS transistors U23 and U27 are connected to a metal line BS23. Gates of a plurality of MOS transistors U24 and U26 are connected to a metal line BS22, and gates of a plurality of MOS transistors U25 are connected to a metal line BS21.

The selecting circuit 2c also has a decoder 21c for decoding a column address and for activating voltage levels on the metal lines BS21–BS25 in response to the column address signal.

The selecting circuit 3c has a plurality of N-type MOS transistors U30–U38 corresponding to the unit block Bi. A source-drain path of MOS transistor U30 is connected between the diffused lines D0 and a source line SLi (where i is an integer) preferably made of metal (e.g., aluminum), and a source-drain path of MOS transistor U31 is connected between the diffused line D2 and the source line SLi. A source-drain path of MOS transistor U32 is connected between the diffused lines D4 and a source line SLi, a source-drain path of MOS transistor U33 is connected between the diffused line D6 and the source line SLi, and a source-drain path of MOS transistor U34 is connected between the diffused lines D7 and a source line SLi.

A source-drain path of MOS transistor U35 is connected between the diffused lines D9 and a source line SL(i+1) of the next adjacent unit block B(i+1), and a source-drain path of MOS transistor U36 is connected between the diffused line D10 and the source line SL(i+1). A source-drain path of MOS transistor U37 is connected between the diffused lines D12 and a source line SL(i+1), and a source-drain path of MOS transistor U38 is connected between the diffused line D14 and the source line SL(i+1).

Gates of a plurality of MOS transistors U30 are connected to a metal line BS35, gates of a plurality of MOS transistors U31 and U38 are connected to a metal line BS34, gates of a plurality of MOS transistors U32 and U37 are connected to a metal line BS33, gates of a plurality of MOS transistors U33 and U36 are connected to a metal line BS32, and gates of a plurality of MOS transistors U34 and U35 are connected to a metal line BS31.

The selecting circuit 3c also has a decoder 31c for decoding a column address and for activating voltage levels on the metal lines BS31–BS35 in response to the column address signal.

Hereinbelow, the operation of the circuit as shown in FIG. 7 is described.

First, the sense amplifier 33 shown in FIG. 1 precharges all of the bit lines BLi to a precharge level before the selecting circuits 2c and 3c receive an address signal.

Then, for example, when the selecting circuits 2c and 3c receive an address signal corresponding to the MOS transistor M71 of the unit block B2, the decoder 21c changes voltage levels of the metal lines BS22 to an active high level. Therefore, a plurality of MOS transistors U24 and U26 become "ON" to connect the diffused lines D7 and D9 to a corresponding bit line BLi.

The decoder 31c changes a voltage level of the metal line BS32 to an active high level and changes a voltage level of the metal line BS31, BS33, BS34 and BS35 to an inactive low level. Therefore, the MOS transistors U33 and U36 become "ON". Therefore, all of the sources and drains of a plurality of MOS transistors M7k and M10k are connected to corresponding bit lines BLi and source lines SLi or SL(i+1).

However, the precharge circuit 44 shown in FIG. 1 changes a voltage level of the source line SL2 to a reference voltage level (e.g., ground level) from the precharge level in response to the address signal. The precharge circuit 44 maintains voltage levels of the source lines SLi (except for the source line SL2) at the precharge level.

Then, the row decoder 6 shown in FIG. 1 changes a voltage level of the word line WL1 to an active level to select the MOS transistors Mj1. At this time, if the MOS transistor M71 of the unit block B2 has data (e.g., "1"), the voltage level of the bit line BL2 is maintained at the precharge level, because the MOS transistor M71 of the unit block B2 cannot connect the bit line BL2 to the source line SL2 electrically. If the MOS transistor M71 of the unit block B2 has no data (e.g., "0"), the voltage level of the bit line BL2 becomes the reference voltage level (e.g., ground level), because the MOS transistor M71 of the unit block B2 can connect the bit line BL2 to the source line SL2 electrically.

Voltage levels of the bit lines BLi (except for the bit line BL2) are maintained at the precharge level, because corresponding source lines SLi (except for the source line SL2) have the precharge level by the precharge circuit 44.

Therefore, the single-chip device according to the fourth embodiment can output the data of the MOS transistor M71 of the unit block B2 by using the bit line BL2.

In this embodiment, a pitch of the diffused lines is a standard pitch. For example, a pitch Pm of metal wires will be 1.6 μm (e.g., 8×0.2 μm) if a pitch Pd of diffused lines is the minimum pitch of 0.2 μm with the present techniques. However, the device according to the fourth embodiment also has higher integration than that of the device shown in FIG. 2, because the pitch Pd in FIG. 2 is 0.75 μm.

Figure 8:
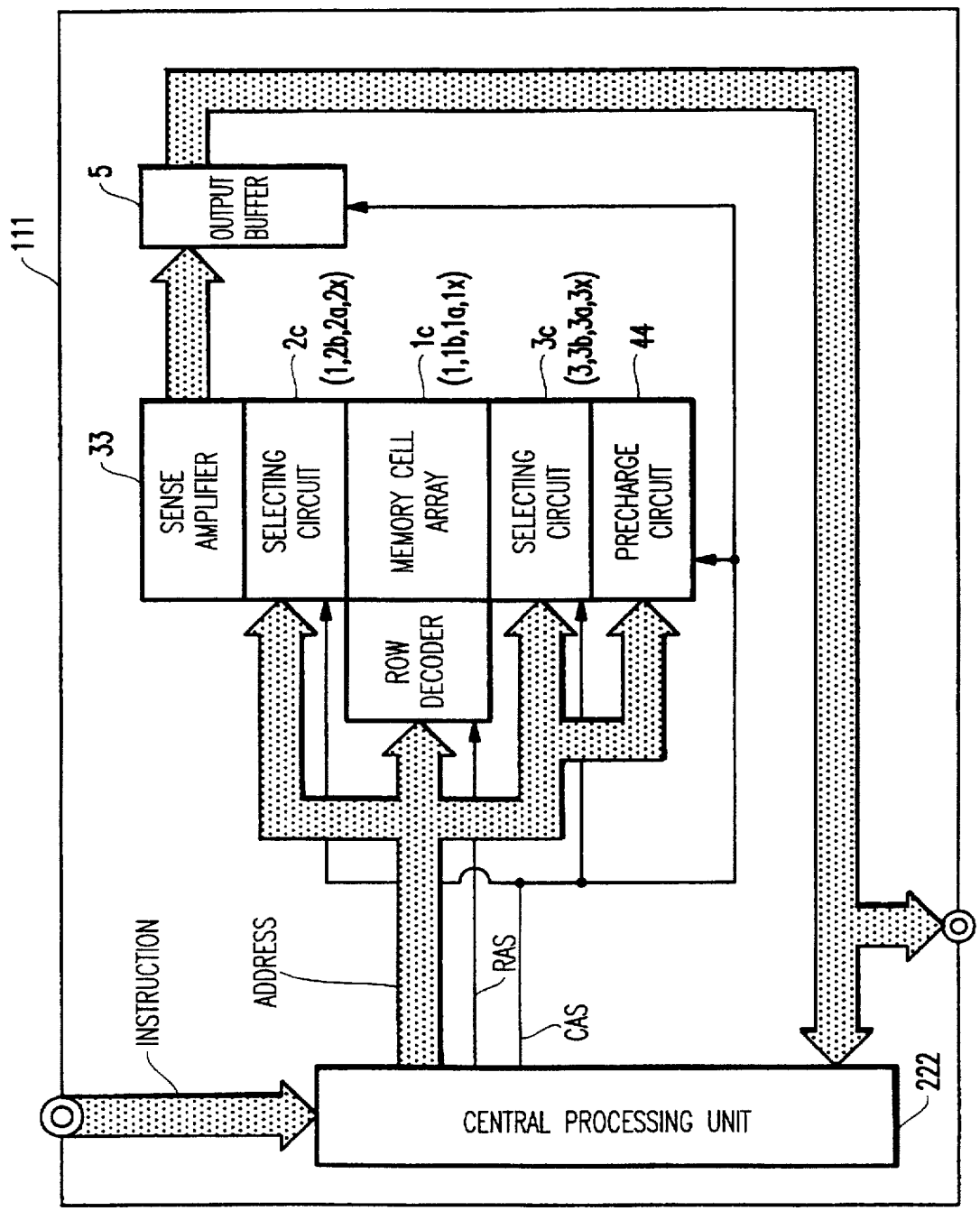
FIG. 8 is a diagram showing a memory system containing an on-chip central processing unit (CPU) according to the present invention.

FIG. 8 shows a single-chip memory device 111 containing an internal (e.g., on-chip) central processing unit (CPU) 222. The CPU 222 receives instructions from an input terminal (unreferenced) and outputs an address signal and executes an instruction using data from the memory cell array 3c. All embodiments mentioned above also could be constructed similarly (e.g., to have an on-chip CPU).

As mentioned above, memory cells arrays 1, 1a, 1b and 1c preferably comprise EPROM cells. However, it is possible to use MROM cells or $E^2PROM$ cells instead of EPROM cells. Further, the number of j and k could be changed depending on the designer's constraints and requirements.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory system comprising:
    a memory cell array including a first unit block and a second unit block having a plurality of read-only memory (ROM) cells;
    a plurality of diffused lines having a first pitch with respect to each other, and connected to sources of said ROM cells;
    first and second bit lines made of metal and respectively connected to drains of said ROM cells in said first and second unit blocks; and
    first and second source lines made of metal and respectively connected to sources of said ROM cells in said first and second unit blocks, wherein a pitch between said first bit line and said first source line, a pitch between said first bit line and said second source line, and a pitch between said second bit line and said second source line each comprise a second pitch, said second pitch being at least three times larger than said first pitch.

2. The memory system as recited in claim 1, wherein said second pitch is at least four times larger than said first pitch.

3. The memory system as recited in claim 1, wherein said second pitch is at least eight times larger than said first pitch.

4. The memory system as recited in claim 3, wherein each of said first unit block and said second unit block comprises:
    first, second, third, fourth, fifth, sixth, seventh, eighth, ninth, tenth, eleventh, twelfth, thirteenth, fourteenth, fifteenth and sixteenth diffused lines of said plurality of diffused lines;
    a first ROM cell having a source-drain path between said first and second diffused lines;
    a second ROM cell having a source-drain path between said second and third diffused lines;
    a third ROM cell having a source-drain path between said third and fourth diffused lines;
    a fourth ROM cell having a source-drain path between said fourth and fifth diffused lines;
    a fifth ROM cell having a source-drain path between said fifth and sixth diffused lines;
    a sixth ROM cell having a source-drain path between said sixth and seventh diffused lines;
    a seventh ROM cell having a source-drain path between said seventh and eighth diffused lines;
    an eighth ROM cell having a source-drain path between said eighth and ninth diffused lines;
    a ninth ROM cell having a source-drain path between said ninth and tenth diffused lines;
    a tenth ROM cell having a source-drain path between said tenth and eleventh diffused lines;
    an eleventh ROM cell having a source-drain path between said eleventh and twelfth diffused lines;
    a twelfth ROM cell having a source-drain path between said twelfth and thirteenth diffused lines;
    a thirteenth ROM cell having a source-drain path between said thirteenth and fourteenth diffused lines;
    a fourteenth ROM cell having a source-drain path between said fourteenth and fifteenth diffused lines;
    a fifteenth ROM cell having a source-drain path between said fifteenth and sixteenth diffused lines; and
    a sixteenth ROM cell having a source-drain path connected to said sixteenth diffused line.

5. The memory system as recited in claim 4, further comprising:
    a first selecting circuit for receiving an address signal and for electrically connecting said first and second bit lines to corresponding diffused lines of said plurality of diffused lines in response to the address signal; and
    a second selecting circuit for receiving the address signal and for electrically connecting said first and second source lines to corresponding diffused lines of said plurality of diffused lines in response to the address signal.

6. The memory system as recited in claim 5, wherein said first selecting circuit comprises:
    a first metal oxide semiconductor (MOS) transistor having a source-drain path between said second diffused line in said first unit block and said first bit line;
    a second MOS transistor having a source-drain path between said fourth diffused line in said first unit block and said first bit line;
    a third MOS transistor having a source-drain path between said sixth diffused line in said first unit block and said first bit line;
    a fourth MOS transistor having a source-drain path between said eighth diffused line in said first unit block and said first bit line;
    a fifth MOS transistor having a source-drain path between said ninth diffused line in said first unit block and said first bit line;
    a sixth MOS transistor having a source-drain path between said tenth diffused line in said first unit block and said first bit line;
    a seventh MOS transistor having a source-drain path between said twelfth diffused line in said first unit block and said first bit line;
    an eighth MOS transistor having a source-drain path between said fourteenth diffused line in said first unit block and said first bit line;
    a ninth MOS transistor having a source-drain path between said sixteenth diffused line in said first unit block and said first bit line; and
    a first decoder, connected to all gates of said MOS transistors, for decoding the address signal, and for activating a corresponding MOS transistor among said MOS transistors in response to the address signal.

7. The memory system as recited in claim 6, wherein said second selecting circuit comprises:

a tenth MOS transistor having a source-drain path between said first diffused line in said first unit block and said first source line;

an eleventh MOS transistor having a source-drain path between said third diffused line in said first unit block and said first source line;

a twelfth MOS transistor having a source-drain path between said fifth diffused line in said first unit block and said first source line;

a thirteenth MOS transistor having a source-drain path between said seventh diffused line in said first unit block and said first source line;

a fourteenth MOS transistor having a source-drain path between said eighth diffused line in said first unit block and said first source line;

a fifteenth MOS transistor having a source-drain path between said tenth diffused line in said first unit block and said second source line;

a sixteenth MOS transistor having a source-drain path between said eleventh diffused line in said first unit block and said second source line;

a seventeenth MOS transistor having a source-drain path between said thirteenth diffused line in said first unit block and said second source line;

an eighteenth MOS transistor having a source-drain path between said fifteenth diffused line in said first unit block and said second source line; and a second decoder, connected to all gates of said tenth to eighteenth MOS transistors, for decoding the address signal, and for activating a corresponding MOS transistor among said tenth to eighteenth MOS transistors in response to the address signal.

8. The memory system as recited in claim 7, wherein the memory system is formed on a single semiconductor chip.

9. The memory system as recited in claim 8, wherein the memory system is operated by an off-chip central processing unit (CPU), said CPU for issuing said address signal.

10. The memory system as recited in claim 8, wherein the memory system further comprises an on-chip central processing unit (CPU), said CPU for issuing said address signal.

11. The memory system as recited in claim 1, wherein each of said first unit block and said second unit block comprises:

first, second, third, fourth, fifth and sixth diffused lines of said plurality of diffused lines;

a first ROM cell of said plurality of ROM cells having a source-drain path between said first and second diffused lines;

a second ROM cell of said plurality of ROM cells having a source-drain path between said second and third diffused lines;

a third ROM cell of said plurality of ROM cells having a source-drain path between said third and fourth diffused lines;

a fourth ROM cell of said plurality of ROM cells having a source-drain path between said fourth and fifth diffused lines;

a fifth ROM cell of said plurality of ROM cells having a source-drain path between said fifth and sixth diffused lines; and a sixth ROM cell of said plurality of ROM cells having a source-drain path connected to said sixth diffused line.

12. The memory system as recited in claim 11, further comprising:

a first selecting circuit for receiving an address signal and for electrically connecting said first and second bit lines to corresponding diffused lines of said plurality of diffused lines in response to the address signal; and a second selecting circuit for receiving the address signal and for electrically connecting said first and second source lines to corresponding diffused lines of said plurality of diffused lines in response to the address signal.

13. The memory system as recited in claim 12, wherein said first selecting circuit comprises:

a first metal oxide semiconductor (MOS) transistor having a source-drain path between said second diffused line in said first unit block and said first bit line;

a second MOS transistor having a source-drain path between said fourth diffused line in said first unit block and said first bit line;

a third MOS transistor having a source-drain path between said sixth diffused line in said first unit block and said first bit line; and a first decoder, connected to gates of said first, second and third MOS transistors, for decoding the address signal, and for activating a corresponding MOS transistor among said first, second and third MOS transistors in response to the address signal.

14. The memory system as recited in claim 13, wherein said second selecting circuit comprises:

a fourth MOS transistor having a source-drain path between said first diffused line in said first unit block and said first source line;

a fifth MOS transistor having a source-drain path between said third diffused line in said first unit block and said first source line;

a sixth MOS transistor having a source-drain path between said fifth diffused line in said first unit block and said second source line; and a second decoder, connected to gates of said fourth, fifth and sixth MOS transistors, for decoding the address signal, and for activating a corresponding MOS transistor among said fourth, fifth and sixth MOS transistors in response to the address signal.

15. The memory system as recited in claim 14, wherein the memory system is formed on a single semiconductor chip.

16. The memory system as recited in claim 15, wherein the memory system is operated by an off-chip central processing unit (CPU), said CPU for issuing said address signal.

17. The memory system as recited in claim 15, wherein the memory system further comprises an on-chip central processing unit (CPU) for issuing said address signal.

18. The single chip memory device comprising:

a plurality of bit lines;

a plurality of source lines operatively coupled to said plurality of bit lines;

first, second, third, fourth, fifth and sixth diffused lines respectively arranged between adjacent ones of said source lines;

a plurality of read-only memory (ROM) cells having respective source-drain paths between respective adjacent diffused lines;

a first selecting circuit for receiving an address signal and for electrically connecting one of said bit lines to corresponding diffused lines of said plurality of diffused lines in response to the address signal; and a second selecting circuit for receiving the address signal and for electrically connecting one of said source lines to corresponding diffused lines of said plurality of diffused lines in response to the address signal, wherein a pitch between one of said bit lines and an adjacent one of said source lines is at least three times larger than a pitch between said diffused lines.

19. The single chip memory device as recited in claim 18, wherein said single chip memory device further comprises;

a first ROM cell having a source-drain path between said first and second diffused lines;

a second ROM cell having a source-drain path between said second and third diffused lines;

a third ROM cell having a source-drain path between said third and fourth diffused lines;

a fourth ROM cell having a source-drain path between said fourth and fifth diffused lines;

a fifth ROM cell having a source-drain path between said fifth and sixth diffused lines; and a sixth ROM cell having a source-drain path connected to said sixth diffused line.

* * * * *